United States Patent
Sumino et al.

(10) Patent No.: US 9,777,215 B2
(45) Date of Patent: Oct. 3, 2017

(54) OXYNITRIDE PHOSPHOR POWDER

(71) Applicant: Ube Industries, Ltd., Ube-shi (JP)

(72) Inventors: Mao Sumino, Ube (JP); Takuma Sakai, Ube (JP); Kazuki Iwashita, Ube (JP); Masataka Fujinaga, Ube (JP); Shinsuke Jida, Ube (JP)

(73) Assignee: Ube Industries, Ltd. (JP)

( * ) Notice: Subject to any disclaimer, the term of this patent is extended or adjusted under 35 U.S.C. 154(b) by 139 days.

(21) Appl. No.: 14/890,972

(22) PCT Filed: May 26, 2014

(86) PCT No.: PCT/JP2014/063838
§ 371 (c)(1),
(2) Date: Nov. 13, 2015

(87) PCT Pub. No.: WO2014/192694
PCT Pub. Date: Dec. 4, 2014

(65) Prior Publication Data
US 2016/0122642 A1    May 5, 2016

(30) Foreign Application Priority Data

May 28, 2013 (JP) ................. 2013-111633

(51) Int. Cl.
*C09K 11/77* (2006.01)
*C09K 11/08* (2006.01)
*H01L 33/50* (2010.01)

(52) U.S. Cl.
CPC ...... *C09K 11/7792* (2013.01); *C09K 11/0883* (2013.01); *H01L 33/502* (2013.01);
(Continued)

(58) Field of Classification Search
CPC .................................................. C09K 11/7792
(Continued)

(56) References Cited

U.S. PATENT DOCUMENTS 7,064,095 B2 * 6/2006 Mandal ................ C04B 35/597
501/98.2
7,597,821 B2 * 10/2009 Sakuma ............... C04B 35/597
252/301.4 F
(Continued)

FOREIGN PATENT DOCUMENTS

CN      102124077         7/2011
JP      2002-363554 A    12/2002
(Continued)

OTHER PUBLICATIONS

Supplementary European Search Report dated Jan. 23, 2017, of corresponding European Application No. 14804175.9.

*Primary Examiner* — Matthew E Hoban
(74) *Attorney, Agent, or Firm* — DLA Piper LLP (US)

(57) ABSTRACT

An oxynitride phosphor powder is an α-SiAlON phosphor having a dominant wavelength of 565-577 nm and fluorescence intensity and external quantum efficiency that are high enough for practical use. The oxynitride phosphor powder comprises an α-SiAlON represented by the compositional formula: $Ca_{x1}Eu_{x2}Yb_{x3}Si_{12-(y+z)}Al_{(y+z)}O_zN_{16-z}$ (wherein $0.0<x1\leq2.0$, $0.0000<x2\leq0.0100$, $0.0000<x3\leq0.0100$, $0.4\leq x2/x3\leq1.4$, $1.0\leq y\leq4.0$, $0.5\leq z\leq2.0$).

11 Claims, 3 Drawing Sheets

(52) U.S. Cl.
CPC .............. *H01L 2224/48095* (2013.01); *H01L 2224/48472* (2013.01); *H01L 2924/181* (2013.01)

(58) Field of Classification Search
USPC .................................................. 252/301.4 F
See application file for complete search history.

(56) References Cited

U.S. PATENT DOCUMENTS

| | | | |
|---|---|---|---|
| 2003/0030038 A1* | 2/2003 | Mitomo | C04B 35/597 252/500 |
| 2003/0052595 A1 | 3/2003 | Ellens et al. | |
| 2003/0168643 A1 | 9/2003 | Mitomo et al. | |
| 2004/0155225 A1* | 8/2004 | Yamada | C04B 35/597 252/301.4 R |
| 2007/0166218 A1* | 7/2007 | Hirosaki | C01B 21/0826 423/325 |
| 2007/0248519 A1* | 10/2007 | Mitomo | C01B 21/0821 423/263 |
| 2008/0064586 A1* | 3/2008 | Mitomo | C04B 35/597 501/98.2 |
| 2009/0091237 A1* | 4/2009 | Hirosaki | C09K 11/0883 313/495 |
| 2011/0149550 A1* | 6/2011 | Jermann | C04B 35/597 362/84 |
| 2013/0001815 A1 | 1/2013 | Yamao et al. | |

FOREIGN PATENT DOCUMENTS

| | | |
|---|---|---|
| JP | 2003-203504 A | 7/2003 |
| JP | 2003-336059 A | 11/2003 |
| JP | 2004-186278 A | 7/2004 |
| JP | 2006-257326 | 9/2006 |
| JP | 2007-031201 A | 2/2007 |
| JP | 2010-043242 A | 2/2010 |
| JP | 2010-275437 A | 12/2010 |
| JP | 2012-036408 A | 2/2012 |
| WO | 2013/147066 A1 | 10/2013 |

* cited by examiner

OXYNITRIDE PHOSPHOR POWDER

TECHNICAL FIELD

The present invention relates to an oxynitride phosphor powder comprising a rare earth metal element-activated α-SiAlON that is suitable for an ultraviolet to blue light source. More specifically, the present invention relates to an oxynitride phosphor powder having a fluorescence dominant wavelength of 565 to 577 nm and a practical fluorescence intensity.

BACKGROUND ART

Recently, with practical implementation of a blue light-emitting diode (LED), development of a white LED using this blue LED is being aggressively pursued. Use of a white LED in liquid crystal panel backlight, indoor or outdoor lighting device, etc. is evolving and expanding because of its low power consumption and long life compared with existing white light sources.

The white LED having developed at present is obtained by applying a Ce-doped YAG (yttrium-aluminum-garnet) onto the surface of a blue LED. The Ce-doped YAG phosphor exhibits a fluorescence spectrum having a fluorescence peak wavelength in the vicinity of 560 nm and a dominant wavelength in the vicinity of 570 nm. However, the YAG phosphor activated by Ce has a problem in that the fluorescence intensity deteriorates as the temperature increases, namely, the temperature characteristics are poor.

Considering the above, many oxynitride phosphors are being studied and among others, an α-SiAlON phosphor activated by Eu is known to have excellent temperature characteristics and emit fluorescence having a fluorescence peak wavelength (yellow-orange) of 580 to 590 nm (see, Patent Document 1).

Other than the α-SiAlON activated by Eu, a Ca-α-SiAlON activated by Ce is known to emit blue to green fluorescence (see, Patent Documents 2 and 3). In addition, a Ca-α-SiAlON activated by Pr is known to have a fluorescence peak at 450 to 750 nm (see, Patent Document 4). Furthermore, it is known that a Ca-α-SiAlON activated by Yb exhibits green emission having a fluorescence peak of about 550 nm (see, Patent Document 5) and a Ca-α-SiAlON co-activated by Eu and Dy exhibits yellow emission having a fluorescence peak wavelength of about 580 nm (see, Patent Document 4).

However, the Ce-activated Ca-α-SiAlON described in Patent Documents 2 and 3 shows a very low efficiency by excitation with excitation light of 450 nm, and the Pr-activated Ca-α-SiAlON described in Patent Document 4 does not have an excitation band in the vicinity of 450 nm, making it difficult to obtain high fluorescence efficiency by using a blue LED.

As described above, specific examples of an α-SiAlON phosphor having yellow emission comparable to that of a YAG phosphor activated by Ce have not been disclosed.

RELATED ART

Patent Document

Patent Document 1: Kokai (Japanese Unexamined Patent Publication) No. 2012-36408
Patent Document 2: Kokai No. 2010-275437
Patent Document 3: Kokai No. 2003-203504
Patent Document 4: Kokai No. 2002-363554
Patent Document 5: Kokai No. 2003-336059

SUMMARY OF THE INVENTION

Problems to be Solved by the Invention

With respect to a yellow phosphor producing a pseudo-white color by the combination with a blue LED, a phosphor having good temperature characteristics is demanded, nevertheless, as described above, an α-SiAlON phosphor having a dominant wavelength of about 570 nm and good fluorescence temperature characteristics is not known.

An object of the present invention is to provide an oxynitride phosphor powder having practicably high fluorescence intensity and high external quantum efficiency, comprising an α-SiAlON phosphor having a dominant wavelength of 565 to 577 nm.

Means to Solve the Problems

As a result of intensive studies to solve the above-described problems, the present inventors have found that an oxynitride phosphor powder comprising α-SiAlON, represented by the composition formula:

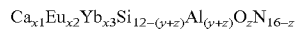
$$Ca_{x1}Eu_{x2}Yb_{x3}Si_{12-(y+z)}Al_{(y+z)}O_zN_{16-z}$$

(wherein $0.0<x1\leq2.0$, $0.0000<x2\leq0.0100$, $0.0000<x3\leq0.0100$, $0.4\leq x2/x3\leq1.4$, $1.0\leq y\leq4.0$, and $0.5\leq z\leq2.0$), exhibits yellow emission having a dominant wavelength of 565 to 577 nm by excitation with light having a wavelength of 450 nm and leads to obtaining an oxynitride phosphor powder having high fluorescence intensity and high external quantum efficiency. The present invention has been accomplished based on this finding.

The present invention relates to an oxynitride phosphor powder comprising an α-SiAlON represented by the composition formula:

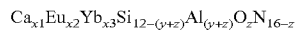
$$Ca_{x1}Eu_{x2}Yb_{x3}Si_{12-(y+z)}Al_{(y+z)}O_zN_{16-z}$$

(wherein $0.0<x1\leq2.0$, $0.0000<x2\leq0.0100$, $0.0000<x3\leq0.0100$, $0.4\leq x2/x3\leq1.4$, $1.0\leq y\leq4.0$, and $0.5\leq z\leq2.0$).

In particular, the present invention relates to the oxynitride phosphor powder, wherein in the composition formula above, x1, x2, x3, y and z are $0.9<x1\leq1.5$, $0.0035\leq x2\leq0.0060$, $0.0040\leq x3\leq0.0080$, $0.6\leq x2/x3\leq1.1$, $2.0\leq y\leq3.0$, and $1.0\leq z\leq1.5$.

The present invention also relates to the oxynitride phosphor powder, wherein fluorescence having a dominant wavelength in the wavelength region of 565 to 577 nm is emitted by excitation with light having a wavelength of 450 nm and the external quantum efficiency is 41% or more.

In addition, the present invention relates to a method for producing an oxynitride phosphor powder, comprising:

a first step of mixing a silicon source, an aluminum source, a calcium source, a europium source and an ytterbium source to provide a composition represented by the composition formula:

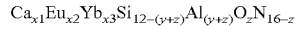
$$Ca_{x1}Eu_{x2}Yb_{x3}Si_{12-(y+z)}Al_{(y+z)}O_zN_{16-z}$$

(wherein $0.0<x1\leq2.0$, $0.0000<x2\leq0.0100$, $0.0000<x3\leq0.0100$, $0.4\leq x2/x3\leq1.4$, $1.0\leq y\leq4.0$, and $0.5\leq z\leq2.0$), followed by firing at a temperature of 1,500 to 2,000° C. in an inert gas atmosphere to obtain a fired oxynitride represented by the formula above, and a second step of heat-treating the fired oxynitride at a temperature of 1,100 to 1,600° C. in an inert gas atmosphere.

The present invention also relates to the method for producing an oxynitride phosphor powder, wherein the silicon source is a silicon nitride powder and the silicon nitride powder has an oxygen content of 0.2 to 0.9 mass %, an average particle size of 1.0 to 12.0 μm and a specific surface area of 0.2 to 3.0 m²/g.

Furthermore, the present invention relates to a light-emitting device comprising a light-emitting source and a phosphor, wherein the light-emitting source is a light-emitting diode and the phosphor uses at least the above-described oxynitride phosphor powder comprising α-SiAlON.

Effects of the Invention

According to the present invention, an oxynitride phosphor comprising α-SiAlON is configured as an α-SiAlON phosphor powder represented by the composition formula:

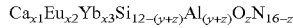

wherein $0.0<x1\leq2.0$, $0.0000<x2\leq0.0100$, $0.0000<x3\leq0.0100$, $0.4\leq x2/x3\leq1.4$, $1.0\leq y\leq4.0$, and $0.5\leq z\leq2.0$, whereby an oxynitride phosphor capable of emitting yellow fluorescence having a dominant wavelength of 565 to 577 nm by excitation with light having a wavelength of 450 nm and exhibiting high fluorescence intensity and high external quantum efficiency thereof is provided.

MODE FOR CARRYING OUT THE INVENTION

Figure 1:
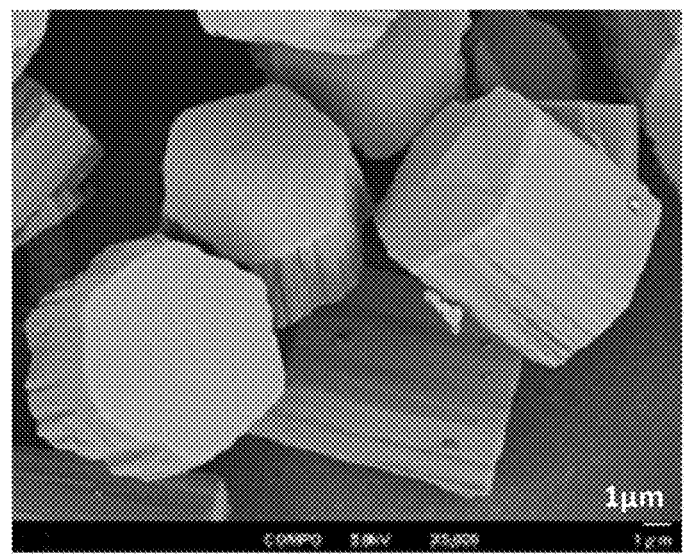
FIG. 1 is a scanning electron micrograph showing the silicon nitride powder for the production of an oxynitride phosphor powder in Examples 1 to 22.

The present invention is described in detail below.

The present invention relates to an oxynitride phosphor composing α-SiAlON represented by the composition formula:

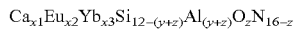

wherein the oxynitride phosphor powder composed of α-SiAlON satisfies $0.0<x1\leq2.0$, $0.0000<x2\leq0.0100$, $0.0000<x3\leq0.0100$, $0.4\leq x2/x3\leq1.4$, $1.0\leq y\leq4.0$, and $0.5\leq z\leq2.0$, wherein the oxynitride phosphor powder emits fluorescence having a dominant wavelength in the wavelength region of 565 to 577 nm by excitation with light having a wavelength of 450 nm and fluorescence intensity and external quantum efficiency thereof are high.

α-SiAlON, particularly, Ca-α-SiAlON, is a solid solution where the Si—N bonds of an α-type silicon nitride are partially replaced by an Al—N bonds and an Al—O bonds and Ca ions penetrate and are solid-solved in the lattice and, thereby keeping the electrical neutrality.

In the α-SiAlON phosphor contained in the oxynitride phosphor of the present invention, Eu ions penetrate and are solid-solved in the lattice in addition to Ca ions, and the Ca-α-SiAlON is thereby activated to make the phosphor represented by the formula above, which emits yellow-to-orange fluorescence by excitation with blue light.

A general α-SiAlON phosphor activated by a rare earth element is, as described in Patent Document 1, represented by $MeSi_{12-(m+n)}Al_{(m+n)}O_nN_{16-n}$ (wherein Me is one member or two or more members of Ca, Mg, Y, and a lanthanide metal except for La), and the metal Me is solid-solved in the range from, at the minimum, one element per three large unit cells to, at the maximum, one element per one unit cell, of α-SiAlON including four mass weights of $(Si,Al)_3(N,O)_4$. The solid solubility limit is generally, when the metal element Me is divalent, $0.6<m<3.0$ and $0\leq n<1.5$ in the formula above and, when the metal Me is trivalent, $0.9<m<4.5$ and $0\leq n<1.5$.

Li, Ca, Mg, Y, etc., have been studied as the metal Me, and in addition, an α-SiAlON phosphor where the metal element is partially or completely replaced by a rare earth element as an activator, has been studied. As the activator, rare earth elements such as Ce, Pr, Nd, Sm, Eu, Tb, Dy, Er, Tm and Yb are often studied. However, regarding α-SiAlON in which two or more kinds of activators are solid-solved, only a Ca-α-SiAlON co-activated by Eu and Dy is presented in Patent Document 4.

The present inventors have made intensive studies on an α-SiAlON phosphor in which two or more kinds of activators are solid-solved, as a result, it has been found that a Ca-α-SiAlON phosphor co-activated by Eu and Yb has an emission color with a dominant wavelength of 565 to 577 nm, which is an emission color comparable to that of the Ce-activated YAG phosphor, and the emission intensity and external quantum efficiency thereof are high.

The oxynitride phosphor powder of the present invention is specifically described below.

The oxynitride phosphor powder of the present invention is an oxynitride phosphor powder comprising α-SiAlON, represented by the composition formula:

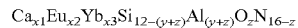

wherein $0.0<x1\leq2.0$, $0.0000<x2\leq0.0100$, $0.0000<x3\leq0.0100$, $0.4\leq x2/x3\leq1.4$, $1.0\leq y\leq4.0$, and $0.5\leq z\leq2.0$.

x1, x2 and x3 are values indicating respective amounts of Ca ion, Eu ion and Yb ion penetrated and solid-solved in the SiAlON. Here, it is known that not a chromaticity coordinate but a dominant wavelength can be used to indicate the emission chromaticity of a phosphor. As described in JIS Z 7801, when chromaticity coordinates of achromatic color and emission spectrum on a chromaticity diagram are connected by a straight line, the dominant wavelength means a wavelength at a point where an extension line of the above straight line intersects with the spectrum locus. In another way of expression, the dominant wavelength is a wavelength of spectrum monochromatic light when the color produced by additive color mixture of white light and the spectrum monochromatic light becomes the same as the emission color of a phosphor. In the present application, hereinafter, the same is applied to the dominant wavelength. If x3 exceeds 0.01, the dominant wavelength falls below 565 nm and the fluorescence intensity thereof is reduced. If x2 exceeds 0.01, the dominant wavelength becomes longer than 577 nm. Furthermore, if x1 exceeds 2.0, the fluorescence intensity and external quantum efficiency are reduced.

In the present invention, x2 and x3 preferably satisfy the relationship of $0.4\leq x2/x3\leq1.4$. In the case of a composition where x2/x3 is in this range, a dominant wavelength of 565 to 577 nm is achieved and in addition, a highly efficient oxynitride phosphor with higher fluorescence intensity is provided.

y is a value determined so as to keep electrical neutrality when a metal element in solid-solved in SiAlON and is represented by $y=2(x1)+3(x2)+3(x3)$ in the oxynitride phosphor powder above. The coefficient of 2 of x1 in the formula is a numerical value based on the valence of Ca ion solid-solved in the Ca-α-SiAlON phosphor; the coefficient of 3 of x2 in the formula is a numerical value based on the valence of Eu ion solid-solved in the Ca-α-SiAlON phosphor; and the coefficient of 3 of x3 in the formula is a numerical value based on the valence of Yb ion solid-solved in the Ca-α-SiAlON phosphor.

In the present invention, y and z are in the ranges of $1.0 \le y \le 4.0$ and $0.5 \le z \le 2.0$. In the case of a composition where y and z are in these ranges, a dominant wavelength of 565 to 577 nm is achieved, and an oxynitride phosphor with high fluorescence intensity thereof is provided.

If y exceeds 4.0, the dominant wavelength becomes longer than 577 nm and the fluorescence intensity and external quantum efficiency of the emission thereof are reduced. In addition, if y is less than 1.0, the fluorescence intensity and external quantum efficiency are reduced. Furthermore, z is a value related to the amount of solid solution and substitution of oxygen in α-SiAlON. If z exceeds 2.0, the dominant wavelength becomes shorter than 565 nm and the fluorescence intensity and external quantum efficiency of the emission thereof are reduced. In addition, if y<1.0 and z<0.5, β-SiAlON is produced to significantly reduce the fluorescence intensity.

In the case where x1, x2, x3, y and z are $0.0<x1 \le 2.0$, $0.0000<x2 \le 0.0100$, $0.0000<x3 \le 0.0100$, $0.4 \le x2/x3 \le 1.4$, $1.0 \le y \le 4.0$ and $0.5 \le z \le 2.0$, an oxynitride phosphor having a dominant wavelength of 565 to 577 nm, a high fluorescence intensity and a high external quantum efficiency of 41% or more is provided.

In addition, in the present invention, x1, x2, x3, y and z are preferably $0.9<x1 \le 1.5$, $0.0035 \le x2 \le 0.0060$, $0.0040 \le x3 \le 0.0080$, $0.6 \le x2/x3 \le 1.1$, $2.0 \le y \le 3.0$ and $1.0 \le z \le 1.5$. In the case of a composition where x1, x2, x3, y and z are in these ranges, an oxynitride phosphor having a dominant wavelength of 565 to 575 nm, a high fluorescence intensity and a high external quantum efficiency of 47% or more is provided.

Furthermore, in the present invention, x1, x2, x3, y and z are more preferably $1.2<x1 \le 1.5$, $0.0035 \le x2 \le 0.0060$, $0.0050 \le x3 \le 0.0080$, $0.7 \le x2/x3 \le 1.1$, $2.0 \le y \le 3.0$ and $1.2 \le z \le 1.3$.

In the case of a composition where x1, x2, x3, y and z are in these ranges, a dominant wavelength of 565 to 575 nm, a higher fluorescence intensity, and an external quantum efficiency of 48% or more are more advantageously ensured.

When crystal phases are identified by an X-ray diffractometer (XRD) using CuKα radiation, the oxynitride phosphor powder of the present invention comprises an α-SiAlON crystal phase classified into a trigonal system. In addition, an aluminum nitride crystal phase classified into a hexagonal system is sometimes contained, but if the content of an aluminum nitride crystal phase is too much increased, the fluorescence intensity is disadvantageously reduced. The amount of aluminum nitride contained is preferably 10 mass % or less, more preferably 5 mass % or less. Furthermore, an oxynitride phosphor powder composed of only α-SiAlON without containing aluminum nitride is preferable.

Identification of the crystal phase in XRD measurement can be performed using an X-ray pattern analysis software. The analysis software includes, for example, PDXL produced by Rigaku Corporation. Incidentally, XRD measurement of the α-SiAlON phosphor powder was performed using X-ray diffractometer (Ultima IV Protectus) and analysis software (PDXL) produced by Rigaku Corporation.

In order to suitably use the oxynitride phosphor powder of the present invention as a phosphor for white LED, $D_{50}$ that is a 50% diameter (volume-based median value) in the particle size distribution curve is preferably from 10.0 to 20.0 μm. If $D_{50}$ is less than 10.0 μm or the specific surface area exceeds 0.6 m$^2$/g, the emission intensity may be reduced. If $D_{50}$ exceeds 20.0 μm or the specific surface area is less than 0.2 m$^2$/g, the powder may be hardly dispersed uniformly in the resin encapsulating the phosphor, and variation sometimes occurs in the color tone of white LED. The oxynitride phosphor powder of the present invention is advantageous in that a particle having $D_{50}$ in the range above (from 10.0 to 20.0 μm) can be obtained directly after firing or only by disassociation without pulverization or, if desired, further by classification. When the powder is pulverized, distortion, etc. of the crystal structure may be caused to deteriorate the emission characteristics such as luminance.

As to the method for controlling the particle size and specific surface area of the oxynitride phosphor powder of the present invention, these can be controlled by controlling the particle size of the silicon nitride powder as a raw material. Use of a silicon nitride powder having an average particle size of 1.0 to 12.0 μm is preferable, because $D_{50}$ of the oxynitride phosphor powder becomes 10 to 20 μm and at the same time, the specific surface area becomes from 0.2 to 0.6 m$^2$/g, leading to a higher external quantum efficiency.

$D_{50}$ of the oxynitride phosphor powder is a 50% diameter in the particle size distribution curve measured by a laser diffraction/scattering particle size distribution measuring apparatus. In addition, the specific surface area of the oxynitride phosphor powder can be measured by a specific surface area measuring apparatus, FlowSorb Model 2300, manufactured by Shimadzu Corporation (BET method by nitrogen gas adsorption).

The oxynitride phosphor powder of the present invention can emit fluorescence having a dominant wavelength in the wavelength region of 565 to 577 mm by excitation with light in a wavelength region of 450 nm, and the fluorescence intensity thereof is high. In turn, according to the oxynitride phosphor powder of the present invention, a long-wavelength yellow fluorescence can be efficiently obtained by excitation with blue light, and white light having good color rendering property can be efficiently obtained by combination with blue light used as excitation light.

The fluorescence properties can be measured by a fluorescence spectrophotometer (FP-6500) manufactured by JASCO Corp. Spectrum correction can be performed using a secondary standard light source, but the fluorescence peak wavelength sometimes slightly varies depending on the measuring instrument or correction conditions used. In addition, the external quantum efficiency can be calculated from the product of an absorptivity and an internal quantum efficiency, which are measured by a solid quantum efficiency measuring apparatus fabricated by combining an integrating sphere with FP6500 manufactured by JASCO Corp. Furthermore, the fluorescence dominant wavelength and chromaticity coordinates (Cx, Cy) can be measured using the color analysis software attached to the fluorescence spectrophotometer. The absorptivity means a value indicating how much of the excitation light applied is absorbed by the sample. The internal quantum efficiency is the conversion efficiency when the absorbed light is converted to light emitted as fluorescence (number of photons emitted as fluorescence/number of photons absorbed by sample).

In the present invention, the fluorescence peak wavelength and the fluorescence intensity at that wavelength were derived from the obtained fluorescence spectrum. The relative fluorescence intensity indicative of luminance is defined as a relative value of the emission intensity at the fluorescence peak wavelength where the maximum intensity value in an emission spectrum of a commercially available YAG:Ce-based phosphor (P46Y3, produced by Kasei Optonix, Ltd.) excited by the same excitation wavelength is taken as 100%.

The oxynitride phosphor powder of the present invention can be used in a light-emitting device for various lighting units by combining the powder with a known light-emitting source such as light-emitting diode.

Among others, a light-emitting source capable of emitting excitation light having a peak wavelength of 330 to 500 nm is suitable for the oxynitride phosphor powder of the present invention. In the ultraviolet region, the oxynitride phosphor powder exhibits a high luminous efficiency, making it possible to configure a light-emitting element having high performance. The luminous efficiency of the phosphor powder excited by a blue light source is also high, and a light-emitting element of excellent daytime white color or daylight color can be configured by the combination of yellow-orange fluorescence of the oxynitride phosphor powder of the present invention with blue excitation light.

Furthermore, the oxynitride phosphor of the present invention renders a yellow to orange object color and therefore, can be applied to a coating material, an ink, etc., as an alternative material for a pigment containing a heavy metal such as iron, copper, manganese and chromium, e.g., iron oxide. In addition, the oxynitride phosphor powder can be used as an ultraviolet or visible light absorbing material for wide applications.

The production method of the oxynitride phosphor powder of the present invention is specifically described below.

The oxynitride phosphor powder of the present invention is obtained by mixing a silicon source, an aluminum source, a calcium source, a europium source and an ytterbium source to provide a composition represented by the composition formula:

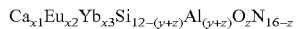

$$Ca_{x1}Eu_{x2}Yb_{x3}Si_{12-(y+z)}Al_{(y+z)}O_zN_{16-z}$$

(wherein $0.0 < x1 \leq 2.0$, $0.0000 < x2 \leq 0.0100$, $0.0000 < x3 \leq 0.0100$, $0.4 \leq x2/x3 \leq 1.4$, $1.0 \leq y \leq 4.0$, and $0.5 \leq z \leq 2.0$), and firing the mixture at a temperature of 1,500 to 2,000° C. in an inert gas atmosphere. Preferably, the fired product obtained is further heat-treated at a temperature of 1,100 to 1,600° C. in an inert gas atmosphere.

The silicon source of the raw material is selected from nitride, oxynitride and oxide of silicon and a precursor substance capable of becoming an oxide of silicon by pyrolysis. Among others, crystalline silicon nitride is preferable, and by using crystalline silicon nitride, an oxynitride phosphor powder having high luminance can be obtained.

The aluminum source of the raw material includes aluminum oxide, metal aluminum and aluminum nitride, and respective powders thereof may be used individually or in combination.

The calcium source of the raw material is selected from nitride, oxynitride and oxide of calcium and a precursor substance capable of becoming an oxide of calcium by pyrolysis.

The europium source of the raw material is selected from nitride, oxynitride and oxide of europium and a precursor substance capable of becoming an oxide of europium by pyrolysis.

The ytterbium source of the raw material is selected from nitride, oxynitride and oxide of ytterbium and a precursor substance capable of becoming an oxide of ytterbium by pyrolysis.

The average particle size of the silicon nitride powder as a raw material for the production of the oxynitride phosphor powder of the present invention is preferably from 1.0 to 12.0 μm, more preferably from 3.0 to 12.0 μm. If the average particle size is less than 1.0 μm, the oxygen content tends to increase, and the external quantum efficiency is likely to decrease. If the average particle size exceeds 12.0 μm, the production may be difficult, and this is not practical. Incidentally, the average particle size of the silicon nitride powder was measured from a scanning electron micrograph of the silicon nitride powder. Specifically, a circle was drawn in the scanning electron micrograph and for each individual particle contacting with the circle, a maximum circle inscribed in the particle was determined. The diameter of the determined circle was taken as the particle size, and the average particle size of the powder was calculated by averaging the particle sizes of those particles. The number of particles measured was adjusted to become from about 50 to 150.

The specific surface area of the silicon nitride powder is preferably from 0.2 to 3.0 m$^2$/g, more preferably from 0.2 to 1.0 m$^2$/g. Production of a crystalline silicon nitride powder having a specific surface area of less than 0.2 m$^2$/g may be difficult and not practical and causes a problem in device fabrication. If the specific surface area exceeds 3 m$^2$/g, the external quantum efficiency is likely to be reduced. Therefore, the specific surface area is preferably from 0.2 to 3.0 m$^2$/g. Incidentally, the specific surface area was measured by a specific surface area measuring apparatus, FlowSorb Model 2300, manufactured by Shimadzu Corporation (BET method by nitrogen gas adsorption).

As the silicon nitride powder used for the production of the oxynitride phosphor powder of the present invention, a crystalline silicon nitride powder can be preferably used as described above, and an α-silicon nitride powder is preferable.

In one aspect of the present invention, as the silicon nitride powder used for the production of the oxynitride phosphor powder of the present invention, a crystalline silicon nitride powder and an α-silicon nitride powder, each having a small oxygen content, can be preferably used among others. The oxygen content of the conventional silicon nitride powder as a raw material for the phosphor is from 1.0 to 2.0 mass %, but in a preferable embodiment of the present invention, a silicon nitride powder having a small oxygen content of 0.2 to 0.9 mass % is used as a phosphor raw material, whereby an oxynitride phosphor powder exhibiting a remarkably higher fluorescence intensity than the conventional α-SiAlON phosphor using the conventional silicon nitride powder can be obtained. The oxygen content in the silicon nitride is preferably from 0.2 to 0.8 mass %, more preferably from 0.2 to 0.4 mass %. It may be difficult in view of production to reduce the oxygen amount to less than 0.2 mass %, and if the oxygen amount exceeds 0.9 mass %, significant enhancement of the fluorescence properties of the oxynitride phosphor powder of the present invention, compared with a case of using the conventional silicon nitride powder, can be hardly achieved. Incidentally, the oxygen content was measured by an oxygen/nitrogen simultaneous analyzer manufactured by LECO.

The silicon nitride powder that is preferably usable for the production of the oxynitride phosphor powder of the present invention can be obtained by thermally decomposing a nitrogen-containing silane compound and/or an amorphous silicon nitride powder. The nitrogen-containing silane compound includes silicon diimide (Si(NH)$_2$), silicon tetraamide, silicon nitrogen imide, silicon chloroimide, etc. These are produced by a known method, for example, a method of reacting a silicon halide such as silicon tetrachloride, silicon tetrabromide or silicon tetraiodide with ammonia in a gas phase, or a method of reacting the silicon halide above in a liquid form with liquid ammonia.

As for the amorphous silicon nitride powder, those produced by a known method, for example, a method of heating and decomposing the nitrogen-containing silane compound above at a temperature of 1,200 to 1,460° C. in a nitrogen or ammonia gas atmosphere, or a method of reacting a silicon halide such as silicon tetrachloride, silicon tetrabromide or silicon tetraiodide with ammonia at a high temperature, are used. The average particle size of the amorphous silicon nitride powder and nitrogen-containing silane compound is usually from 0.003 to 0.05 μm.

The above-described nitrogen-containing silane compound powder and amorphous silicon nitride powder are readily hydrolyzed or oxidized and therefore, such a raw material powder is weighed in an inert gas atmosphere. In addition, the oxygen concentration in a nitrogen gas flowing into a heating furnace used for heating and decomposing the nitrogen-containing silane compound can be controlled in the range of 0 to 2.0 vol %. An amorphous silicon nitride powder having a low oxygen content is obtained by limiting the oxygen concentration in the atmosphere during heating and decomposition of the nitrogen-containing silane compound, for example, to 100 ppm or less, preferably 10 ppm or less. As the oxygen content of the amorphous silicon nitride powder is lower, the oxygen content of the obtained crystalline silicon nitride particle decreases. Furthermore, the content of metal impurities mixed in the amorphous silicon nitride powder may be reduced to 10 ppm or less by a known method where the material of reaction vessel and the rubbing state between powder and metal in a powder handling device are improved.

Subsequently, the nitrogen-containing silane compound and/or amorphous silicon nitride powder are fired at 1,300 to 1,700° C. in a nitrogen or ammonia gas atmosphere to obtain a crystalline silicon nitride powder. The particle size may be controlled by controlling the firing conditions (temperature and temperature rise rate). In the present invention, in order to obtain a low-oxygen crystalline silicon nitride powder, oxygen that is simultaneously contained in a nitrogen gas atmosphere as the firing atmosphere when firing a nitrogen-containing silane compound to an amorphous silicon nitride powder needs to be controlled. At the time of firing an amorphous silicon nitride powder to a crystalline silicon nitride powder, a slow temperature rise, e.g., at 40° C./h or less is required so as to obtain a crystalline silicon nitride powder having a large particle size. In the thus-obtained crystalline silicon nitride powder, as shown in FIG. 1, large primary particles are substantially in a monodisperse state, and aggregated particles and fused particles are scarcely formed. The obtained crystalline silicon nitride powder is a high-purity powder having a metal impurity content of 100 ppm or less. In addition, a low-oxygen crystalline silicon nitride powder is obtained by subjecting the crystalline silicon nitride powder above to a chemical treatment such as acid washing. In this way, a silicon nitride powder having an oxygen amount of 0.2 to 0.9 mass % for the production of the oxynitride phosphor powder of the present invention can be obtained.

The thus-obtained silicon nitride powder does not require strong pulverization, unlike silicon nitride produced by direct nitridation of metal silicon, and therefore, is characterized in that the impurity amount is as very small as 100 ppm or less. The amount of impurities (Al, Ca, Fe) contained in the crystalline silicon nitride powder of the present invention is kept at 100 ppm or less, preferably 20 ppm or less, whereby an oxynitride phosphor powder exhibiting a high external quantum efficiency is advantageously obtained.

The silicon nitride powder raw material having a low oxygen content can be preferably used in general for the production of the oxynitride phosphor powder of the present invention and is also useful for the production of, among others, the oxynitride phosphor powder where in the composition formula above, x1, x2, x3, y and z are $0.0<x1\leq2.0$, $0.0000<x2\leq0.0100$, $0.0000<x3\leq0.0100$, $0.4\leq x2/x3\leq1.4$, $1.0\leq y\leq4.0$ and $0.5\leq z\leq2.0$. In this composition, it is preferable that not only the silicon nitride powder raw material has the above-described low oxygen content but also the average particle size thereof is in the above-described range, i.e., from 1.0 to 12.0 μm, preferably from 3.0 to 12.0 μm, and the specific surface area thereof is from 0.2 to 3.0 m$^2$/g, furthermore from 0.2 to 1.0 m$^2$/g. When the oxygen content, average particle size and specific surface area of the silicon nitride powder raw material are in these ranges, the oxynitride phosphor powder obtained advantageously emits fluorescence where the dominant wavelength of fluorescence emitted by excitation with light having a wavelength of 450 nm is from 565 to 577 nm, the external quantum efficiency thereof having 41% or more.

In addition, the silicon nitride powder raw material having a low oxygen content is useful also for the production of the oxynitride phosphor powder where in the composition formula above, x1, x2, x3, y and z are $0.9<x1\leq1.5$, $0.0035\leq x2\leq0.0060$, $0.0040\leq x3\leq0.0080$, $0.6\leq x2/x3\leq1.1$, $2.0\leq y\leq3.0$ and $1.0\leq z\leq1.5$. In this composition, it is preferable that not only the silicon nitride powder raw material has the above-described low oxygen content but also the average particle size thereof is in the above-described range, i.e., from 1.0 to 12.0 μm, preferably from 3.0 to 12.0 μm, and the specific surface area thereof is from 0.2 to 3.0 m$^2$/g, furthermore from 0.2 to 1.0 m$^2$/g. When the oxygen content, average particle size and specific surface area of the silicon nitride powder raw material are in these ranges, the oxynitride phosphor powder obtained advantageously emits fluorescence where the peak wavelength of fluorescence emitted by excitation with light having a wavelength of 450 nm is in a wavelength region of 565 to 575 nm, the external quantum efficiency thereof being 47% or more.

In the firing, an Li-containing compound working as a sintering aid is preferably added for the purpose of accelerating the sintering and producing an α-SiAlON crystal phase at a lower temperature. The Li-containing compound used includes lithium oxide, lithium carbonate, metal lithium, and lithium nitride, and respective powders thereof may be used individually or in combination. The amount of the Li-containing compound added is appropriately from 0.01 to 0.5 mol, in terms of Li element, per mol of the fired oxynitride.

The method for mixing the silicon source, the aluminum source, the calcium source, the europium source, and the ytterbium source is not particularly limited, and a method known per se, for example, a method of dry mixing these sources, or a method of wet mixing the sources in an inert solvent substantially incapable of reacting with each component of the raw material and then removing the solvent, may be employed. As for the mixing apparatus, a V-type mixer, a rocking mixer, a ball mill, a vibration mill, a medium stirring mill, etc., may be used.

A mixture of the silicon source, the aluminum source, the calcium source, the europium source, and the ytterbium substance is fired at a temperature of 1,500 to 2,000° C. in an inert gas atmosphere, whereby a fired oxynitride represented by the composition formula above can be obtained. If the firing temperature is less than 1,500° C., the production of α-SiAlON requires heating for a long time and this is not practical. If the temperature exceeds 2,000° C., silicon nitride and α-SiAlON are sublimated and decomposed to produce free silicon and therefore, an oxynitride phosphor powder exhibiting a high external quantum efficiency cannot be obtained. Firing in a state of an inert gas being pressurized is preferable, because sublimation and decomposition can be suppressed. The heating furnace used for firing is not particularly limited as long as firing at 1,500 to 2,000° C. in an inert gas atmosphere can be performed. For example, a batch electric furnace of high frequency induction heating system or resistance heating system, a rotary kiln, a fluidized firing furnace, and a pusher-type electric furnace can be used. As for the crucible to be filled with the mixture, a BN-made crucible, a silicon nitride-made crucible, a graphite-made crucible, and a silicon carbide-made crucible can be used. The fired oxynitride obtained by firing is a powder with little aggregation and good dispersibility.

The fired oxynitride obtained by the firing as described above may be further heat-treated. By heat-treating the fired oxynitride at a temperature of 1,100 to 1,600° C. in an inert gas atmosphere or a reducing gas atmosphere, an oxynitride phosphor powder exhibiting, among others, a high external quantum efficiency when emitting fluorescence having a dominant wavelength of 565 to 577 nm by excitation with light having a wavelength of 450 nm can be obtained. In order to obtain an oxynitride phosphor powder exhibiting a higher external quantum efficiency, the heat treatment temperature is preferably from 1,500 to 1,600° C. If the heat treatment temperature is less than 1,100° C. or exceeds 1,600° C., the external quantum efficiency of the obtained oxynitride phosphor powder is reduced. The holding time at a maximum temperature in the case of performing a heat treatment is preferably 0.5 hours or more so as to obtain particularly a high external quantum efficiency. Even when the heat treatment is performed for more than 4 hours, the external quantum efficiency is a little enhanced for the extension of time or is scarcely changed. Therefore, the holding time at a maximum temperature in the case of performing a heat treatment is preferably from 0.5 to 4 hours.

The heating furnace used for the heat treatment is not particularly limited as long as a heat treatment at a temperature of 1,100 to 1,600° C. in an inert gas atmosphere or a reducing gas atmosphere can be performed. For example, a batch electric furnace of high frequency induction heating system or resistance heating system, a rotary kiln, a fluidized firing furnace, and a pusher-type electric furnace can be used. As for the crucible to be filled with the mixture, a BN-made crucible, a silicon nitride-made crucible, a graphite-made crucible, a silicon carbide-made crucible, and an alumina-made crucible can be used.

One preferable embodiment of the oxynitride phosphor powder of the present invention is a phosphor powder obtained by the production method described above, more specifically, an oxynitride phosphor powder represented by the composition formula:

$$Ca_{x1}Eu_{x2}Yb_{x3}Si_{12-(y+z)}Al_{(y+z)}O_zN_{16-z}$$

wherein $0.0 < x1 \leq 2.0$, $0.0000 < x2 \leq 0.0100$, $0.0000 < x3 \leq 0.0100$, $0.4 \leq x2/x3 \leq 1.4$, $1.0 \leq y \leq 4.0$ and $0.5 \leq z \leq 2.0$, which is obtained by mixing a silicon source, an aluminum source, a calcium source, a europium source and an ytterbium source, firing the mixture at a temperature of 1,500 to 2,000° C. in an inert gas atmosphere, and then heating the fired product at a temperature of 1,100 to 1,600° C. in an inert gas atmosphere.

A light-emitting device utilizing the above-described oxynitride phosphor as a wavelength conversion member is described below. The light-emitting device includes, for example, a lighting fixture such as fluorescent lamp, and a display device such as display. A semiconductor light-emitting element (light-emitting diode) may be used for the excitation light source of the wavelength conversion member. As the light-emitting element, not only a light-emitting diode emitting visible light but also a light-emitting diode emitting near ultraviolet light or deep ultraviolet light can be used.

Figure 4:
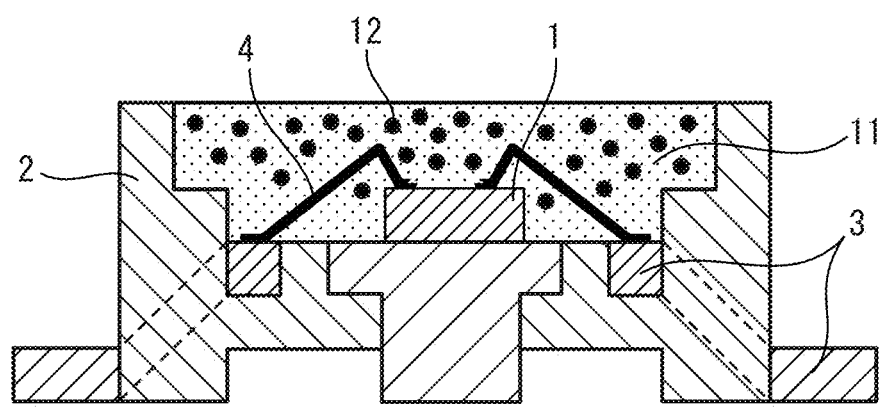
FIG. 4 is a cross-sectional view illustrating the light-emitting device of the present invention.

In FIG. 4, a light-emitting device 1 of a surface mounting type is shown as one embodiment of the present invention. FIG. 4 illustrates a cross-sectional view of the light-emitting device. The light-emitting element 1 can use a nitride light-emitting diode emitting blue light or a nitride light-emitting diode emitting near ultraviolet light. A light-emitting diode emitting blue light is described by way of example. The light-emitting element 1 used is a nitride semiconductor light-emitting element containing, as a light-emitting layer, an InGaN semiconductor having an emission peak wavelength of about 460 nm. An electrode (not shown) in the light-emitting element 1 and a lead electrode 3 provided in a package 2 are connected by a bonding wire 4 composed of Au, etc.

The oxynitride phosphor 12 of the present invention is dispersed, for example, in a ratio of 5 to 50 wt % in a resin layer comprising silicone resin, whereby a phosphor layer 11 can be formed. As the resin, an epoxy resin, a fluororesin, etc., can be used, other than a silicone resin. As for the method to form the phosphor layer 11, the layer can be thinly and uniformly formed on the light-emitting diode by potting, screen printing or other method. If the phosphor layer 11 is too thick, phosphor particles disadvantageously overlap each other and result in deviation from the target chromaticity or a reduction in the luminous efficiency. In the phosphor layer 11, in addition to the oxynitride phosphor powder of the present invention, a phosphor capable of emitting red or green light by excitation with blue light may be added so as to improve the color rendering or color reproduction property.

Figure 5:
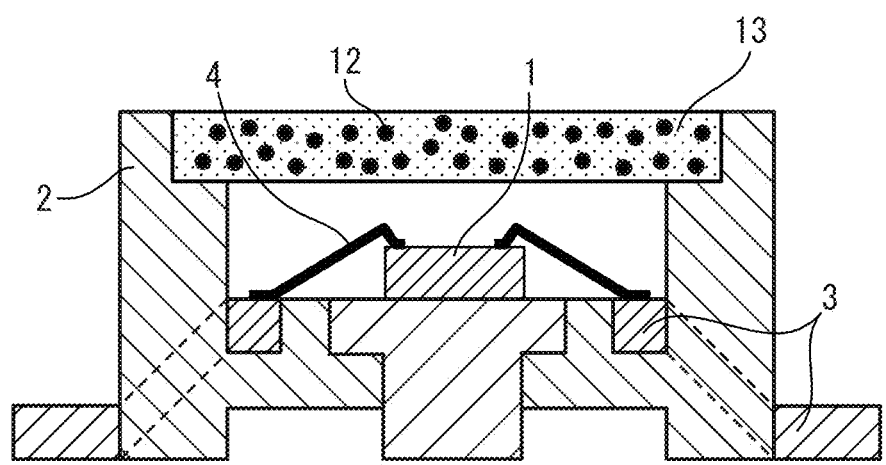
FIG. 5 is a cross-sectional view illustrating a modification example of the light-emitting device of the present invention.

FIG. 5 is a cross-sectional view illustrating an embodiment different from FIG. 4. FIG. 5 differs in that instead of the phosphor layer, a phosphor sheet 13 is provided apart from the light-emitting diode 1. The oxynitride phosphor 12 of the present invention is dispersed, for example, in a ratio of 5 to 50 wt % in a resin layer sheet comprising a silicone resin, whereby the phosphor sheet 13 can be formed. As the resin, an epoxy resin, a fluororesin, etc., can be used, other than a silicone resin. Thanks to a structure where the phosphor sheet 13 is provided apart from the light-emitting diode 1, the variation according to the light emitting site can be advantageously reduced.

EXAMPLES

The present invention is described in greater detail below by referring to specific examples.

Example 1

Silicon nitride, europium oxide, ytterbium oxide, aluminum nitride and calcium carbonate were weighed in a nitrogen-purged glove box to provide the designed oxynitride composition in Table 1 and mixed using a dry vibration mill to obtain a mixed powder. The specific surface area and average particle size of the silicon nitride powder were 0.3 m$^2$/g and 8.0 μm, respectively. The mixed powder obtained was put in a BN-made crucible and after charging the crucible into a graphite resistance heating-type atmospheric pressure firing furnace, the temperature was raised to 1,800° C. in the state of keeping a pressure of 0.8 MPa by introducing nitrogen into the firing furnace and then held at 1,800° C. for 2 hours to obtain a fired oxynitride.

The fired oxynitride obtained was disassociated and classified to obtain a powder having a particle size of 5 to 20 μm and the obtained powder was then put in an alumina crucible. The crucible was charged into a graphite resistance heating-type electric furnace, and the temperature was raised to 1,600° C. and the atmospheric pressure was maintained while flowing nitrogen into the electric furnace and then held at 1,600° C. for 1 hour to obtain the oxynitride phosphor of the present invention.

In order to evaluate the fluorescence properties of the obtained oxynitride phosphor powder, the fluorescence spectrum at an excitation wavelength of 450 nm was measured using a solid quantum efficiency measuring apparatus fabricated by combining an integrating sphere with FP-6500 manufactured by JASCO Corp., and the absorptivity and internal quantum efficiency were measured at the same time. The fluorescence peak wavelength and the emission intensity at that wavelength were derived from the obtained fluorescence spectrum, and the external quantum efficiency was calculated from the absorptivity and internal quantum efficiency. In addition, the chromaticity coordinates (Cx, Cy) and predominant wavelength were measured using a color analysis software provided in the measuring apparatus. Incidentally, the relative fluorescence intensity indicative of luminance was defined as a relative value of the fluorescence intensity at the fluorescence peak wavelength when the maximum intensity value in a fluorescence spectrum of a commercially available YAG:Ce-based phosphor (P46Y3 produced by Kasei Optonix, Ltd.) excited by the same excitation wavelength is taken as 100%. The evaluation results on the fluorescence properties of the oxynitride phosphor according to Example 1 are shown in Table 2.

Examples 2 to 22

Figure 2:
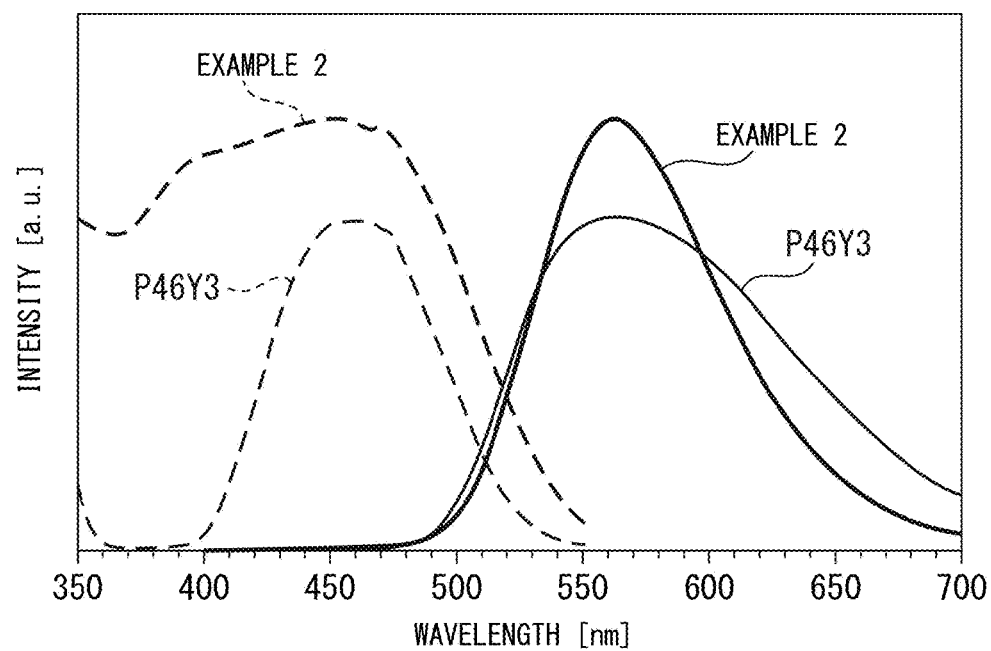
FIG. 2 is a view illustrating the excitation spectra and fluorescence spectra of Example 2 and a Ce-activated YAG phosphor (P46Y3).

Oxynitride phosphor powders were obtained by the same method as in Example 1, except that the raw material powders according to Examples 2 to 22 were weighed and mixed to provide the oxynitride phosphor powders having the designed compositions in Table 1. The fluorescence properties of each of the obtained oxynitride phosphor powders were measured by the same method as in Example 1. The results are shown in Table 2. In addition, the excitation and fluorescence spectra of Example 2 and a commercially available YAG:Ce-based phosphor (P46Y3 produced by Kasei Optonix, Ltd.) are shown in FIG. 2. As apparent from FIG. 2, the Ca-α-SiAlON oxynitride phosphor containing both Yb and Eu as activators exhibits a fluorescence spectrum having a dominant wavelength of about 570 nm and a large relative fluorescence intensity, which had not been conventionally obtained.

It is seen from Table 2 that in Examples 2 to 5, 11, 12 and 16 to 20 where the oxynitride phosphor powder satisfies, in the formula above, the ranges of 0.9<x1≤1.5, 0.0035≤x2≤0.0060, 0.0040≤x3≤0.0080, 0.6≤x2/x3≤1.1, 2.0≤y≤3.0 and 1.0≤z<1.5, the dominant wavelength is from 565 to 575 nm and the external quantum efficiency shows a particularly large value of 47% or more.

Comparative Examples 1 to 13

Figure 3:
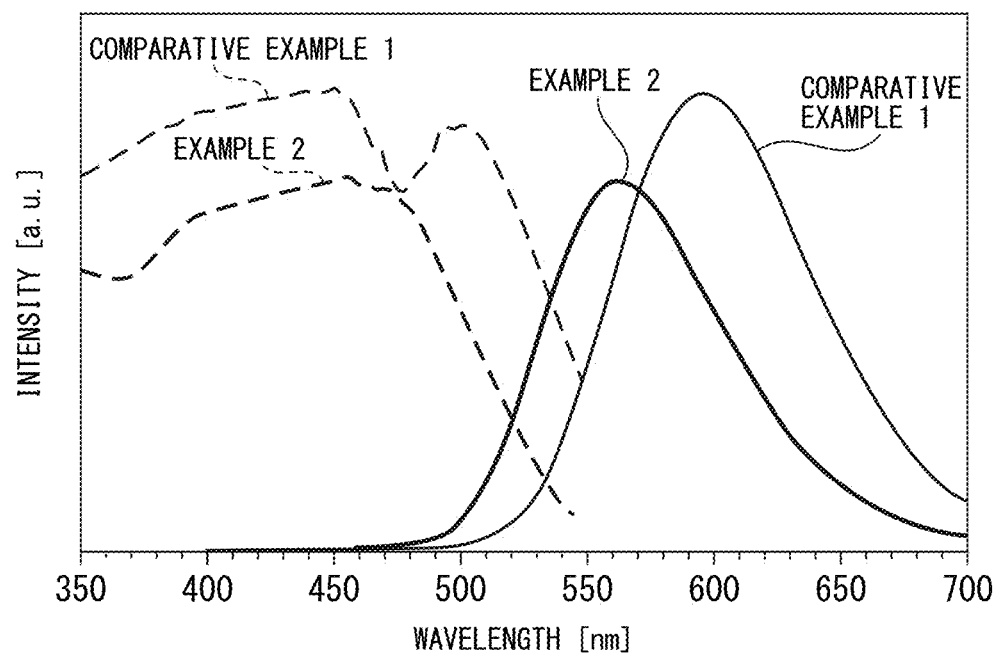
FIG. 3 is a view illustrating the excitation spectra and fluorescence spectra in Example 2 and Comparative Example 1.

Oxynitride phosphor powders were obtained by the same method as in Example 1, except that the raw material powders according to Comparative Examples 1 to 13 were weighed and mixed to provide the oxynitride phosphor powders having the designed compositions in Table 1. The fluorescence properties of each of the obtained oxynitride phosphor powders were measured by the same method as in Example 1. The results are shown in Table 2. In addition, the excitation spectra and fluorescence spectra of Comparative Example 1 and Example 2 are shown in FIG. 3. As apparent from FIG. 3, by containing both Yb and Eu as activators, the emission wavelength is shifted to the low-wavelength side, and an oxynitride phosphor exhibiting a fluorescence spectrum having a dominant wavelength of about 569.7 nm is obtained. On the other hand, in the case of containing only Eu as an activator, the dominant wavelength of the fluorescence spectrum obtained is 585.9 nm and greatly shifted to the long-wavelength side.

Example 31

An oxynitride phosphor powder was obtained by the same method as in Example 3 except that the oxygen concentration of the raw material silicon nitride powder was changed to 0.75 mass %. The fluorescence properties of the obtained oxynitride phosphor powder were measured by the same method as in Example 1. The results are shown in Table 3. It is seen that in Example 3 where the oxygen amount of the silicon nitride powder is 0.29 mass %, the external quantum efficiency after heat treatment is 47.8%, whereas in Example 31 where the oxygen amount is 0.75 mass %, the external quantum efficiency is reduced to 47.2%.

Examples 32 to 37

Oxynitride phosphor powders were obtained by the same method as in Example 3, except that the raw material silicon powder used was a silicon nitride powder having the specific surface area, average particle size and oxygen amount shown in Table 3. The fluorescence properties of each of the obtained oxynitride phosphor powders were measured by the same method as in Example 3. The results are shown in Table 3. It is seen from Table 3 that when the silicon nitride powder has an oxygen content of 0.2 to 0.9 mass % and has an average particle size of 1.0 to 12.0 μm and a specific surface area of 0.2 to 3.0 m$^2$/g or less, particularly, the external quantum efficiency is increased.

TABLE 1

|  | x1 | x2 | x3 | y | z | x2/x3 |
|---|---|---|---|---|---|---|
| Example 1 | 1.20 | 0.00305 | 0.00748 | 2.43 | 1.21 | 0.408 |
| Example 2 | 1.20 | 0.00406 | 0.00647 | 2.43 | 1.21 | 0.628 |
| Example 3 | 1.20 | 0.00466 | 0.00587 | 2.43 | 1.21 | 0.794 |
| Example 4 | 1.20 | 0.00527 | 0.00527 | 2.43 | 1.21 | 1.000 |
| Example 5 | 1.20 | 0.00551 | 0.00503 | 2.43 | 1.21 | 1.096 |
| Example 6 | 1.20 | 0.00574 | 0.00479 | 2.43 | 1.21 | 1.198 |
| Example 7 | 1.20 | 0.00595 | 0.00458 | 2.43 | 1.21 | 1.299 |
| Example 8 | 1.20 | 0.00614 | 0.00439 | 2.43 | 1.21 | 1.399 |
| Example 9 | 0.49 | 0.00192 | 0.00242 | 1.00 | 1.21 | 0.794 |
| Example 10 | 0.74 | 0.00288 | 0.00362 | 1.50 | 1.21 | 0.794 |
| Example 11 | 0.99 | 0.00384 | 0.00483 | 2.00 | 1.21 | 0.794 |
| Example 12 | 1.48 | 0.00575 | 0.00725 | 3.00 | 1.21 | 0.794 |
| Example 13 | 1.73 | 0.00671 | 0.00845 | 3.50 | 1.21 | 0.794 |
| Example 14 | 1.98 | 0.00767 | 0.00966 | 4.00 | 1.21 | 0.794 |

TABLE 1-continued

| | x1 | x2 | x3 | y | z | x2/x3 |
|---|---|---|---|---|---|---|
| Example 15 | 1.20 | 0.00466 | 0.00587 | 2.43 | 0.50 | 0.794 |
| Example 16 | 1.20 | 0.00466 | 0.00587 | 2.43 | 1.00 | 0.794 |
| Example 17 | 1.20 | 0.00466 | 0.00587 | 2.43 | 1.15 | 0.794 |
| Example 18 | 1.20 | 0.00466 | 0.00587 | 2.43 | 1.30 | 0.794 |
| Example 19 | 1.20 | 0.00466 | 0.00587 | 2.43 | 1.41 | 0.794 |
| Example 20 | 1.20 | 0.00466 | 0.00587 | 2.43 | 1.50 | 0.794 |
| Example 21 | 1.20 | 0.00466 | 0.00587 | 2.43 | 1.75 | 0.794 |
| Example 22 | 1.20 | 0.00466 | 0.00587 | 2.43 | 2.00 | 0.794 |
| Comparative Example 1 | 1.20 | 0.01053 | 0.00000 | 2.43 | 1.21 | — |
| Comparative Example 2 | 1.20 | 0.00273 | 0.00780 | 2.43 | 1.21 | 0.350 |
| Comparative Example 3 | 1.20 | 0.00232 | 0.00821 | 2.43 | 1.21 | 0.283 |
| Comparative Example 4 | 1.20 | 0.00624 | 0.00429 | 2.43 | 1.21 | 1.455 |
| Comparative Example 5 | 1.20 | 0.00655 | 0.00398 | 2.43 | 1.21 | 1.646 |
| Comparative Example 6 | 0.45 | 0.00175 | 0.00220 | 0.91 | 1.21 | 0.794 |
| Comparative Example 7 | 0.25 | 0.00096 | 0.00121 | 0.50 | 1.21 | 0.794 |
| Comparative Example 8 | 2.08 | 0.00807 | 0.01017 | 4.21 | 1.21 | 0.794 |
| Comparative Example 9 | 2.27 | 0.00882 | 0.01111 | 4.60 | 1.21 | 0.794 |
| Comparative Example 10 | 1.20 | 0.00466 | 0.00587 | 2.43 | 0.40 | 0.794 |
| Comparative Example 11 | 1.20 | 0.00466 | 0.00587 | 2.43 | 0.00 | 0.794 |
| Comparative Example 12 | 1.20 | 0.00466 | 0.00587 | 2.43 | 2.11 | 0.794 |
| Comparative Example 13 | 1.20 | 0.00466 | 0.00587 | 2.43 | 2.50 | 0.794 |

TABLE 2

| | Peak Wavelength [nm] | Relative Fluorescence Intensity [%] | Absorptivity [%] | External Quantum Efficiency [%] | Internal Quantum Efficiency [%] | Dominant Wavelength [nm] | Chromaticity Coordinate Cx | Cy |
|---|---|---|---|---|---|---|---|---|
| Example 1 | 561.0 | 131 | 77.2 | 44.5 | 57.7 | 569.0 | 0.431 | 0.556 |
| Example 2 | 561.5 | 140 | 79.2 | 47.8 | 60.4 | 569.7 | 0.436 | 0.552 |
| Example 3 | 568.0 | 146 | 78.2 | 47.8 | 61.1 | 572.5 | 0.455 | 0.532 |
| Example 4 | 570.0 | 149 | 79.3 | 49.4 | 62.3 | 573.4 | 0.462 | 0.526 |
| Example 5 | 571.5 | 155 | 77.8 | 48.8 | 62.7 | 574.1 | 0.467 | 0.521 |
| Example 6 | 573.5 | 157 | 78.9 | 49.9 | 63.3 | 575.2 | 0.474 | 0.513 |
| Example 7 | 576.0 | 161 | 79.4 | 50.4 | 63.5 | 576.4 | 0.483 | 0.505 |
| Example 8 | 577.0 | 165 | 80.2 | 51.5 | 64.2 | 576.9 | 0.486 | 0.501 |
| Example 9 | 564.5 | 139 | 75.5 | 45.9 | 60.8 | 570.7 | 0.443 | 0.545 |
| Example 10 | 566.0 | 137 | 76.8 | 45.5 | 59.2 | 571.4 | 0.448 | 0.540 |
| Example 11 | 567.0 | 143 | 77.2 | 47.6 | 61.6 | 571.9 | 0.451 | 0.536 |
| Example 12 | 569.5 | 142 | 79.2 | 49.3 | 62.2 | 573.2 | 0.460 | 0.527 |
| Example 13 | 572.0 | 131 | 80.0 | 46.3 | 57.9 | 574.5 | 0.469 | 0.518 |
| Example 14 | 573.5 | 129 | 80.1 | 45.7 | 57.0 | 575.3 | 0.475 | 0.513 |
| Example 15 | 573.5 | 128 | 78.4 | 45.3 | 57.8 | 575.2 | 0.474 | 0.513 |
| Example 16 | 569.5 | 142 | 78.6 | 47.7 | 60.7 | 573.2 | 0.460 | 0.527 |
| Example 17 | 568.5 | 146 | 78.3 | 47.8 | 61.1 | 572.7 | 0.457 | 0.531 |
| Example 18 | 567.5 | 150 | 78.1 | 48.2 | 61.7 | 572.2 | 0.453 | 0.534 |
| Example 19 | 565.0 | 141 | 77.7 | 47.8 | 61.5 | 571.0 | 0.445 | 0.543 |
| Example 20 | 564.0 | 135 | 78.3 | 47.7 | 60.9 | 570.4 | 0.441 | 0.547 |
| Example 21 | 562.5 | 123 | 78.6 | 43.1 | 54.8 | 569.8 | 0.436 | 0.551 |
| Example 22 | 558.0 | 119 | 76.8 | 41.1 | 53.5 | 567.6 | 0.421 | 0.566 |
| Comparative Example 1 | 597.5 | 161 | 81.6 | 53.5 | 65.6 | 585.9 | 0.549 | 0.439 |
| Comparative Example 2 | 560.0 | 95 | 71.2 | 34.0 | 47.8 | 568.5 | 0.427 | 0.560 |
| Comparative Example 3 | 559.0 | 88 | 70.9 | 32.1 | 45.3 | 567.9 | 0.423 | 0.564 |
| Comparative Example 4 | 579.2 | 154 | 77.3 | 45.8 | 59.3 | 577.9 | 0.493 | 0.494 |
| Comparative Example 5 | 581.4 | 157 | 77.4 | 45.6 | 58.9 | 579.0 | 0.501 | 0.487 |
| Comparative Example 6 | 562.0 | 110 | 72.7 | 34.5 | 47.5 | 569.5 | 0.434 | 0.553 |
| Comparative Example 7 | 561.0 | 106 | 70.9 | 34.7 | 48.9 | 568.9 | 0.430 | 0.557 |
| Comparative Example 8 | 578.1 | 98 | 77.2 | 34.4 | 44.6 | 577.4 | 0.490 | 0.498 |
| Comparative Example 9 | 579.3 | 84 | 77.6 | 33.7 | 43.4 | 578.0 | 0.494 | 0.494 |
| Comparative Example 10 | 573.5 | 101 | 74.4 | 34.9 | 46.9 | 574.9 | 0.472 | 0.516 |
| Comparative Example 11 | 578.0 | 88 | 73.8 | 31.1 | 42.1 | 577.2 | 0.488 | 0.499 |
| Comparative Example 12 | 555.0 | 110 | 69.5 | 33.1 | 47.6 | 566.1 | 0.410 | 0.577 |
| Comparative Example 13 | 551.0 | 78 | 68.2 | 29.3 | 42.9 | 564.2 | 0.397 | 0.590 |

TABLE 3

| | Silicon Nitride (raw material) | | | Fluorescence Properties (before heat treatment) | | | | | | | |
|---|---|---|---|---|---|---|---|---|---|---|---|
| | SSA | Average Particle Diameter | Oxygen Concentration | Peak Wavelength | Relative Fluorescence Intensity | Absorptivity | External Quantum Efficiency | Internal Quantum Efficiency | Dominant Wavelength | Chromaticity Coordinate | |
| | [m$^2$/g] | [μm] | [mass %] | [nm] | [%] | [%] | [%] | [%] | [nm] | Cx | Cy |
| Example 3 | 0.3 | 8.0 | 0.29 | 568.0 | 99 | 78.0 | 30.7 | 39.3 | 572.4 | 0.455 | 0.533 |
| Example 31 | 0.3 | 8.0 | 0.75 | 568.0 | 97 | 78.5 | 30.9 | 39.3 | 572.5 | 0.455 | 0.532 |
| Example 32 | 1.0 | 3.0 | 0.34 | 567.0 | 97 | 77.4 | 30.3 | 39.2 | 572.1 | 0.453 | 0.535 |
| Example 33 | 1.0 | 3.0 | 0.72 | 567.5 | 95 | 77.9 | 29.8 | 38.2 | 572.2 | 0.453 | 0.534 |
| Example 34 | 2.5 | 1.5 | 0.53 | 567.5 | 95 | 77.2 | 29.3 | 37.9 | 572.1 | 0.453 | 0.535 |
| Example 35 | 2.5 | 1.5 | 0.73 | 567.0 | 92 | 77.4 | 30.0 | 38.7 | 571.9 | 0.451 | 0.536 |
| Example 36 | 10 | 0.2 | 0.89 | 567.5 | 92 | 75.9 | 28.5 | 37.6 | 572.2 | 0.453 | 0.534 |
| Example 37 | 10 | 0.2 | 1.12 | 566.5 | 89 | 76.3 | 28.0 | 36.7 | 571.8 | 0.450 | 0.537 |

| | Fluorescence Properties (after heat treatment) | | | | | | | |
|---|---|---|---|---|---|---|---|---|
| | Peak Wavelength | Relative Fluorescence | Absorptivity | External Quantum Efficiency | Internal Quantum Efficiency | Dominant Wavelength | Chromaticity Coordinate | |
| | [nm] | Intensity [%] | [%] | [%] | [%] | [nm] | Cx | Cy |
| Example 3 | 568.0 | 146 | 78.2 | 47.8 | 61.1 | 572.5 | 0.455 | 0.532 |
| Example 31 | 567.5 | 141 | 78.4 | 47.2 | 60.2 | 572.4 | 0.455 | 0.533 |
| Example 32 | 567.5 | 144 | 77.6 | 47.3 | 61.0 | 572.9 | 0.458 | 0.529 |
| Example 33 | 567.0 | 139 | 77.7 | 46.3 | 59.6 | 572.0 | 0.452 | 0.536 |
| Example 34 | 567.5 | 140 | 76.8 | 47.1 | 61.3 | 572.2 | 0.453 | 0.534 |
| Example 35 | 567.0 | 135 | 76.5 | 46.6 | 60.9 | 571.9 | 0.451 | 0.536 |
| Example 36 | 567.0 | 136 | 75.8 | 44.3 | 58.5 | 572.0 | 0.452 | 0.536 |
| Example 37 | 566.5 | 131 | 75.2 | 43.0 | 57.2 | 571.7 | 0.450 | 0.538 |

DESCRIPTION OF REFERENCE NUMERALS

1 Light-emitting element
2 Package
3 Lead electrode
4 Bonding wire
11 Phosphor layer
12 Oxynitride phosphor
13 Phosphor sheet

The invention claimed is:

1. An oxynitride phosphor powder comprising an α-SiAlON, represented by:

$$Ca_{x1}Eu_{x2}Yb_{x3}Si_{12-(y+z)}Al_{(y+z)}O_zN_{16-z}$$

wherein $0.0<x1\leq2.0$, $0.0000<x2\leq0.0100$, $0.0000<x3\leq0.0100$, $0.4\leq x2/x3\leq1.4$, $1.0\leq y\leq4.0$, and $0.5\leq z\leq2.0$.

2. The oxynitride phosphor powder according to claim 1, wherein x1, x2, x3, y and z are $0.9<x1\leq1.5$, $0.0035\leq x2\leq0.0060$, $0.0040\leq x3\leq0.0080$, $0.65\leq x2/x3\leq1.1$, $2.0\leq y\leq3.0$, and $1.0\leq z\leq1.5$.

3. The oxynitride phosphor powder according to claim 1, wherein fluorescence having a dominant wavelength of 565 to 577 nm is emitted upon excitation with light having a wavelength of 450 nm and an external quantum efficiency thereof is 41% or more.

4. A method of producing the oxynitride phosphor powder according to claim 1 comprising:
mixing a silicon source, an aluminum source, a calcium source, a europium source and an ytterbium source to provide a composition represented by:

$$Ca_{x1}Eu_{x2}Yb_{x3}Si_{12-(y+z)}Al_{(y+z)}O_zN_{16-z}$$

wherein $0.0<x1\leq2.0$, $0.0000<x2\leq0.0100$, $0.0000<x3\leq0.0100$, $0.4\leq x2/x3\leq1.4$, $1.0\leq y\leq4.0$, and $0.5\leq z\leq2.0$, firing at a temperature of 1,500 to 2,000° C. in an inert gas atmosphere to obtain a fired oxynitride represented by the above formula, and
heat-treating said fired oxynitride at a temperature of 1,100 to 1,600° C. in an inert gas atmosphere.

5. The method according to claim 4, wherein said silicon source is a silicon nitride powder and said silicon nitride powder has an oxygen content of 0.2 to 0.9 mass %, an average particle size of 1.0 to 12.0 μm and a specific surface area of 0.2 to 3.0 m$^2$/g.

6. A light-emitting device comprising a light-emitting source and a phosphor, wherein the light-emitting source comprises a light-emitting diode and the phosphor uses at least the oxynitride phosphor powder according to claim 1.

7. The oxynitride phosphor powder according to claim 2, wherein fluorescence having a dominant wavelength of 565 to 577 nm is emitted upon excitation with light having a wavelength of 450 nm and an external quantum efficiency thereof is 41% or more.

8. A method of producing the oxynitride phosphor powder according to claim 2 comprising:
mixing a silicon source, an aluminum source, a calcium source, a europium source and an ytterbium source to provide a composition represented by:

$$Ca_{x1}Eu_{x2}Yb_{x3}Si_{12-(y+z)}Al_{(y+z)}O_zN_{16-z}$$

wherein $0.0<x1\leq2.0$, $0.0000<x2\leq0.0100$, $0.0000<x3\leq0.0100$, $0.4\leq x2/x3\leq1.4$, $1.0\leq y\leq4.0$, and $0.5\leq z\leq2.0$, firing at a temperature of 1,500 to 2,000° C. in an inert gas atmosphere to obtain a fired oxynitride represented by the above formula, and
heat-treating said fired oxynitride at a temperature of 1,100 to 1,600° C. in an inert gas atmosphere.

9. A method of producing the oxynitride phosphor powder according to claim 3 comprising:

mixing a silicon source, an aluminum source, a calcium source, a europium source and an ytterbium source to provide a composition represented by:

$$Ca_{x1}Eu_{x2}Yb_{x3}Si_{12-(y+z)}Al_{(y+z)}O_zN_{16-z}$$

wherein $0.0 < x1 \leq 2.0$, $0.0000 < x2 \leq 0.0100$, $0.0000 < x3 \leq 0.0100$, $0.4 \leq x2/x3 \leq 1.4$, $1.0 \leq y \leq 4.0$, and $0.5 \leq z \leq 2.0$, firing at a temperature of 1,500 to 2,000° C. in an inert gas atmosphere to obtain a fired oxynitride represented by the above formula, and heat-treating said fired oxynitride at a temperature of 1,100 to 1,600° C. in an inert gas atmosphere.

10. A light-emitting device comprising a light-emitting source and a phosphor, wherein the light-emitting source comprises a light-emitting diode and the phosphor uses at least the oxynitride phosphor powder according to claim 2.

11. A light-emitting device comprising a light-emitting source and a phosphor, wherein the light-emitting source comprises a light-emitting diode and the phosphor uses at least the oxynitride phosphor powder according to claim 3.

* * * * *

UNITED STATES PATENT AND TRADEMARK OFFICE
CERTIFICATE OF CORRECTION

PATENT NO. : 9,777,215 B2  
APPLICATION NO. : 14/890972  
DATED : October 3, 2017  
INVENTOR(S) : Sumino et al.

Page 1 of 1

It is certified that error appears in the above-identified patent and that said Letters Patent is hereby corrected as shown below:

In the Claims

In Column 17, at Line 51, Claim 2, please change "0.65" to -- 0.6 --.

Signed and Sealed this
Fourteenth Day of November, 2017

Joseph Matal
*Performing the Functions and Duties of the*
*Under Secretary of Commerce for Intellectual Property and*
*Director of the United States Patent and Trademark Office*